United States Patent
Park (10) Patent No.: US 9,907,217 B2
(45) Date of Patent: Feb. 27, 2018

(54) COOLING PANEL AND ELECTRONIC COMPONENT PACKAGE INCLUDING THE SAME

(71) Applicant: LG INNOTEK CO., LTD., Seoul (KR)

(72) Inventor: Jong Hyun Park, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/344,907

(22) Filed: Nov. 7, 2016

(65) Prior Publication Data

US 2017/0135252 A1 May 11, 2017

(30) Foreign Application Priority Data

Nov. 9, 2015 (KR) ........................ 10-2015-0156820

(51) Int. Cl.
*H05K 7/20* (2006.01)
*H05K 5/03* (2006.01)

(52) U.S. Cl.
CPC ........... *H05K 7/20927* (2013.01); *H05K 5/03* (2013.01)

(58) Field of Classification Search
CPC ......... H05K 7/20; H05K 7/20927; H05K 5/03
USPC .......................... 361/688, 689, 699, 701–703
See application file for complete search history.

(56) References Cited

U.S. PATENT DOCUMENTS

| | | | | |
|---|---|---|---|---|
| 8,462,531 B2 * | 6/2013 | Nishikimi | .......... | H05K 7/20927 361/679.46 |
| 9,192,083 B2 * | 11/2015 | Moon | ................ | H05K 7/20254 |
| 2007/0163765 A1 * | 7/2007 | Rondier | ................ | H01L 23/473 165/170 |
| 2009/0206662 A1 * | 8/2009 | Kakuda | ................. | B60K 6/365 307/11 |
| 2010/0025126 A1 * | 2/2010 | Nakatsu | ................. | B60L 11/00 180/65.1 |
| 2010/0238629 A1 * | 9/2010 | Shiba | .................... | H01L 23/473 361/699 |
| 2010/0296247 A1 * | 11/2010 | Chang | ................ | H05K 7/20927 361/699 |
| 2011/0051371 A1 * | 3/2011 | Azuma | ................. | B60K 6/445 361/699 |
| 2013/0223009 A1 * | 8/2013 | Nakatsu | ................ | H02M 7/003 361/699 |
| 2013/0292091 A1 * | 11/2013 | Ishikawa | ............... | H01L 23/473 165/96 |
| 2015/0163962 A1 * | 6/2015 | Suzuki | .................. | H02M 7/003 361/699 |
| 2016/0205809 A1 * | 7/2016 | Aoki | .................. | H05K 7/20772 361/699 |

(Continued)

*Primary Examiner* — Steven T Sawyer
*Assistant Examiner* — Yahya Ahmad
(74) *Attorney, Agent, or Firm* — LRK Patent Law Firm (57) ABSTRACT

A cooling panel and an electronic component package including the same. The cooling panel includes first and second surfaces configured to face each other, and a cooling channel which is disposed on the second surface and in which cooling water is circulated, where the cooling channel includes a first channel region, into which cooling water is introduced, and a second channel region, through which the cooling water is discharged, and each of the first and second channel regions includes a plurality of guides, and density of the guides disposed at the first channel region is higher than density of the guides disposed at the second channel region.

18 Claims, 7 Drawing Sheets

(56) References Cited

U.S. PATENT DOCUMENTS

2016/0343640 A1* 11/2016 Gohara ................ H01L 23/473

* cited by examiner

COOLING PANEL AND ELECTRONIC COMPONENT PACKAGE INCLUDING THE SAME

CROSS-REFERENCE TO RELATED APPLICATION

This application claims priority to and the benefit of Korean Patent Application No. 10-2015-0156820, filed on Nov. 9, 2015, the disclosure of which is incorporated herein by reference in its entirety.

BACKGROUND

1. Field of the Invention

Embodiments of the present invention relate to a cooling panel and an electronic component package including the same.

2. Discussion of Related Art

A hybrid vehicle using a motor includes a motor control unit for controlling the motor and a DC/DC converter.

The DC/DC converter, which is a device for transforming a direct current voltage, converts direct current into alternating current, and then direct current can be obtained again through rectification.

Heat is generated in a process of operating the DC/DC converter. Accordingly, a cooling system is generally used to remove heat from the DC/DC converter. However, when an eddy or irregular flow of cooling water occurs in a process of circulating high-pressure cooling water, a problem of decreased cooling efficiency arises.

SUMMARY OF THE INVENTION

Therefore, the present invention has been made in view of the above problems, and it is an objective of the present invention to provide a cooling panel for preventing an eddy phenomenon by improving a flow of cooling water.

The technical problems that are intended to be addressed in the present invention are not restricted to the above described problems, and other problems, which are not mentioned herein, could be clearly understood by those of ordinary skill in the art from details described below.

In accordance with an aspect of the present invention, the above and other objects can be accomplished by providing a cooling panel which includes first and second surfaces configured to face each other, and a cooling channel which is disposed on the second surface and in which cooling water is circulated, wherein the cooling channel includes a first channel region, into which cooling water is introduced, and a second channel region, through which the cooling water is discharged, wherein each of the first and second channel regions includes a plurality of guides, and the density of the guides disposed at the first channel region is higher than the density of the guides disposed at the second channel region.

The cooling panel according to the present invention may further include a cooling water inlet, which is disposed at one side of the cooling panel and connected to the first channel region, and a cooling water outlet, which is disposed at the one side of the cooling panel and connected to the second channel region.

The first and second channel regions may have shapes that are symmetrical to each other.

The first channel region may include first, second, and third guides wherein the second and third guides are arranged to face each other with respect to the first guide, wherein one end of the first guide may be arranged to be closer to the cooling water inlet than one end of each of the second and third guides.

The first channel region may include a first tapered part which is connected to the cooling water inlet, wherein a width of the first tapered part may increase as the first tapered part recedes from the cooling water inlet.

A length between the one ends of the second and third guides and the cooling water inlet may be shorter than a length between a point at which the first tapered part has a maximum width and the cooling water inlet.

The first guide may be formed to extend to the second channel region.

A plurality of protrusions may be included in the first and second channel regions, wherein the number of protrusions disposed at the first channel region may be greater than the number of protrusions disposed at the second channel region.

The cooling channel may have a U-shaped form.

In accordance with another aspect of the present invention, there is provided an electronic component package including: a cooling panel including a first surface at which a plurality of electronic components and a circuit board are disposed and a second surface at which a cooling channel is formed, a first cover configured to cover the first surface by being coupled to the cooling panel, and a second cover configured to cover the second surface by being coupled to the cooling panel, wherein the cooling channel includes a first channel region, into which cooling water is introduced, and a second channel region, through which the cooling water is discharged, wherein each of the first and second channel regions includes a plurality of guides, and density of the guides disposed at the first channel region is higher than density of the guides disposed at the second channel region.

BRIEF DESCRIPTION OF THE DRAWINGS

The above and other objectives, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Since the present invention may be applied with various modifications and may have various embodiments, exemplary embodiments and drawings of the present invention are intended to be explained and exemplified. However, these exemplary embodiments and drawings are not intended to limit the embodiments of the present invention to particular modes of practice, and all changes, equivalents, and substitutes that do not depart from the spirit and technical scope of the present invention should be understood as being encompassed in the present invention.

It should be understood that, although the terms first, second, etc. may be used herein to describe various elements, these elements should not be limited by these terms. These terms are only used to distinguish one element from another element. For example, a second element may be termed a first element and, similarly, a first element may be termed a second element without departing from the teachings of the present invention. As used herein, the term "and/or" includes any or all combinations of one or more of the associated listed items.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present.

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

In the following description of embodiments, it should be understood that when an element is referred to as being "on" or "under" another element, the element can be directly on the other element or one or more intervening elements may be present there between. In addition, it should be understood that such an expression is intended to encompass different orientations of the element, namely, to encompass both upward and downward directions.

Hereinafter, the present invention will be described in detail by explaining exemplary embodiments of the invention with reference to the attached drawings. In the drawings, the same elements are denoted by the same reference numerals, and a repeated explanation thereof will not be given.

Figure 1:
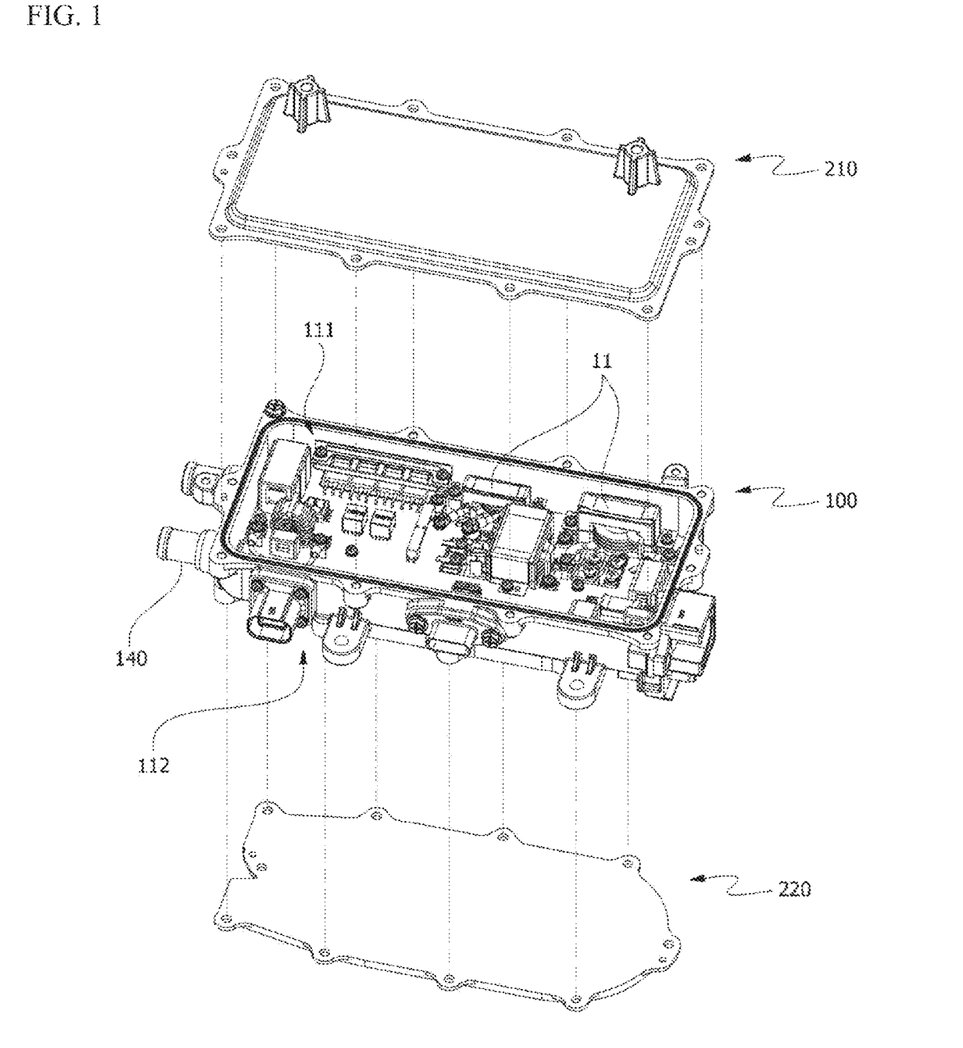
FIG. 1 illustrates a disassembled perspective view of an electronic component package according to an embodiment of the present invention.
Figure 2:
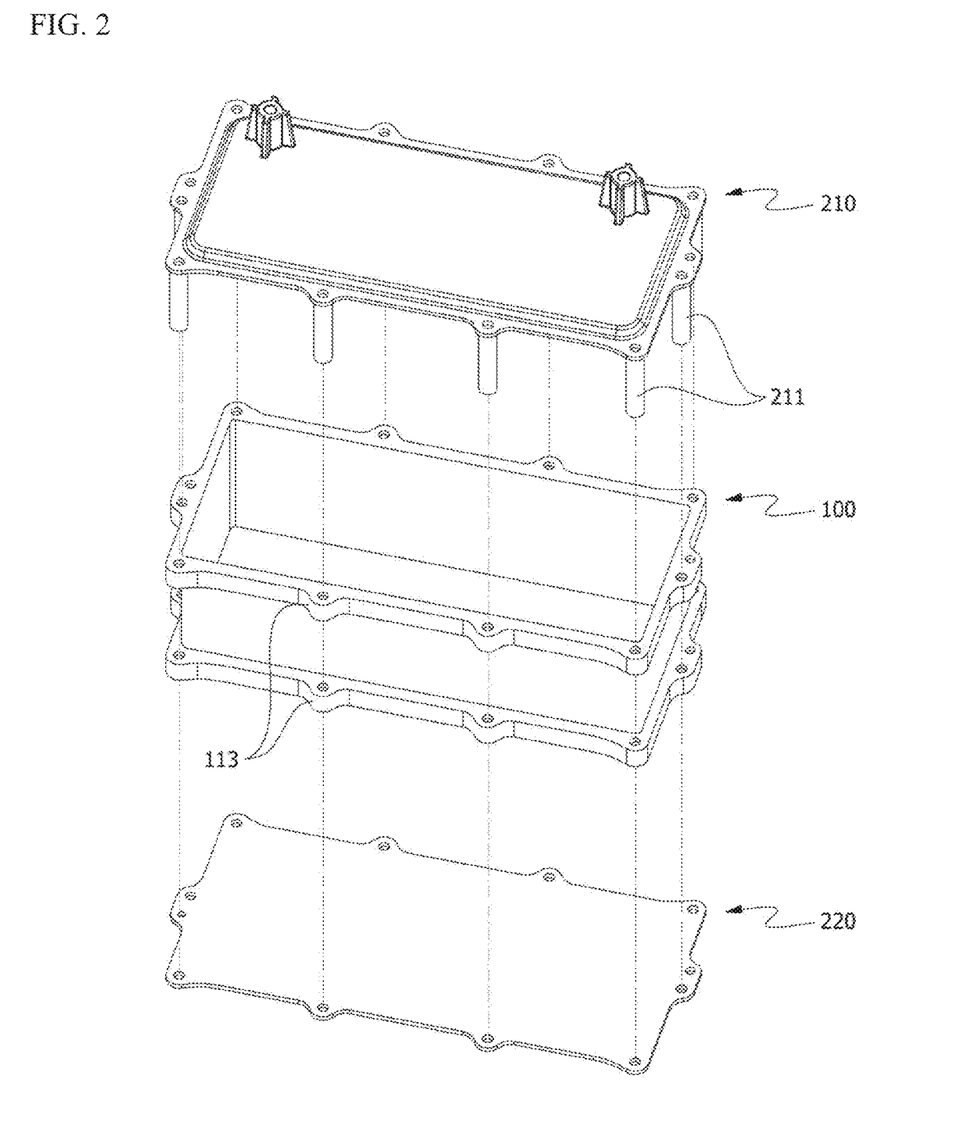
FIG. 2 illustrates a modified example of the electronic component package of FIG. 1.

FIG. 1 illustrates a disassembled perspective view of an electronic component package according to an embodiment of the present invention, and FIG. 2 illustrates a modified example of the electronic component package of FIG. 1.

Referring to FIG. 1, the electronic component package may include a cooling panel 100 including a first surface 111 at which a plurality of electronic components 11 are disposed and a second surface 112 at which a cooling channel is disposed, a first cover 210 configured to cover the first surface 111 of the cooling panel 100, and a second cover 220 configured to cover the second surface 112 of the cooling panel 100.

The electronic component package may have various forms wherein the electronic components 11 are mounted on the first surface 111 of the cooling panel 100. For example, the electronic component package may be various electronic products, such as a DC/DC converter and an AC/DC converter. The cooling channel may be disposed at the second surface 112 of the cooling panel 100 to release heat generated by the electronic components 11. That is, a spacer at which the electronic components 11 are disposed may be disposed at the first surface 111 of the cooling panel 100, and the cooling channel may be disposed at the second surface 112 of the cooling panel 100.

The electronic components 11 may be sealed by the first cover 210 which is being screw connected to the first surface 111, and a cooling channel 120 may be sealed by the second cover 220 which is screw connected to the second surface 112. Screw connection has been provided as an example of a connection method, but the present invention is not limited thereto.

Referring to FIG. 2, the first cover 210 may include bosses 211 protruding toward the second cover 220. Each of the bosses 211 may form a screw connection with the second cover 220 while respectively passing through connecting parts 113 located on a side of the cooling panel 100. However, a location of the boss 211 is not limited thereto, and the bosses 211 may be disposed at the second cover 220.

Since screw connection between the first cover 210 and the cooling panel 100 may be omitted due to such a configuration, quick assembly is possible and material costs may be reduced due to a reduction in the number of screws.

Figure 3:
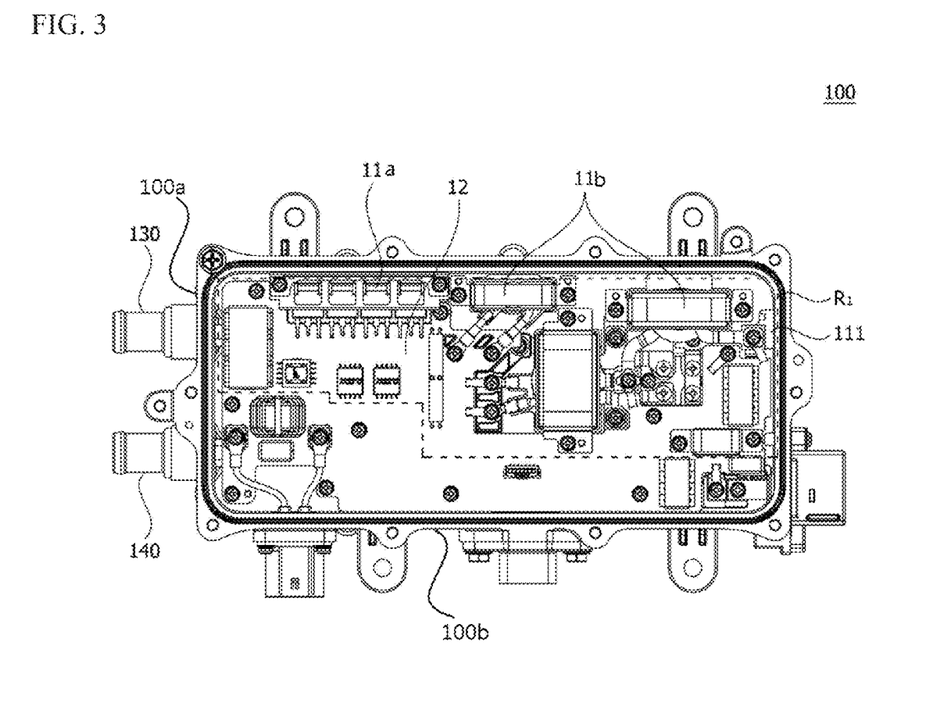
FIG. 3 illustrates a plan view of a cooling panel of FIG. 1.
Figure 4:
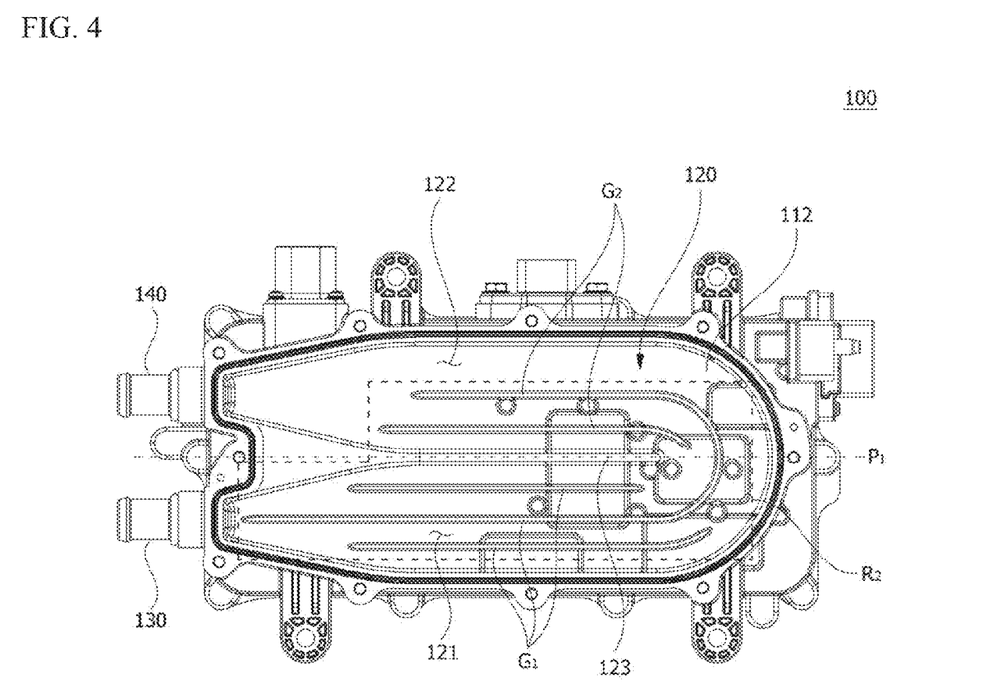
FIG. 4 illustrates a bottom view of a cooling panel of FIG. 1.
Figure 5:
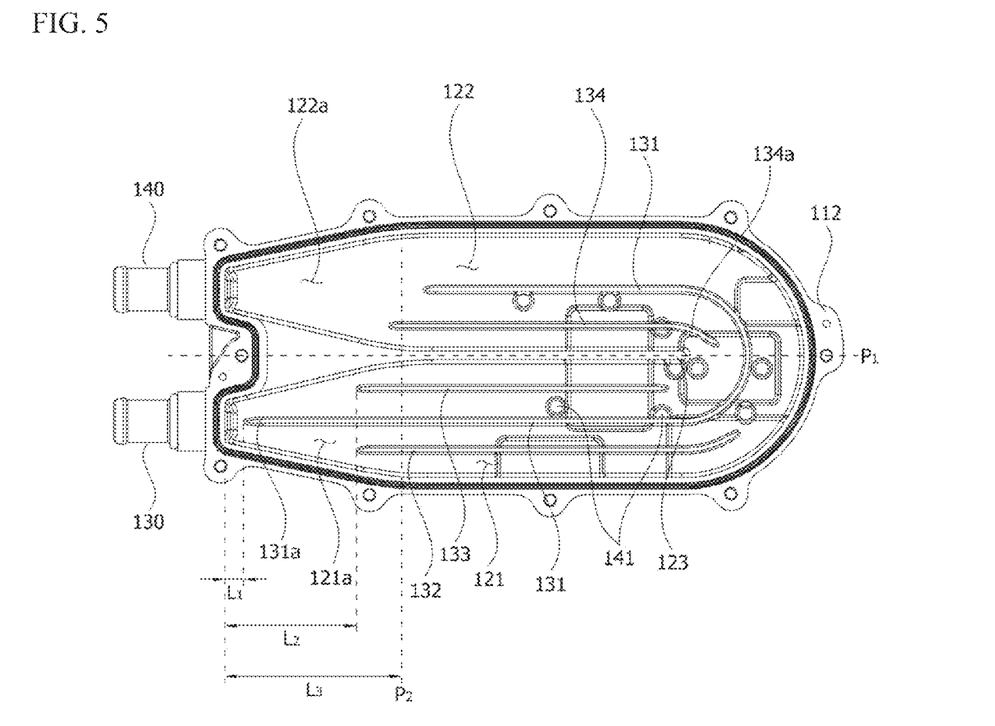
FIG. 5 illustrates a drawing for describing a flow of cooling water introduced into a cooling panel.

FIG. 3 illustrates a plan view of the cooling panel 100 of FIG. 1, and FIG. 4 illustrates a bottom view of the cooling panel 100 of FIG. 1, and FIG. 5 illustrates a drawing for describing a flow of cooling water introduced into the cooling panel 100.

Referring to FIG. 3, the electronic components 11 may be disposed at the first surface 111 of the cooling panel 100. The first surface 111 may be equipped with the electronic components 11 mounted on a circuit board 12.

When the electronic component package is a DC/DC converter, the package may include a switcher connected to input power and a transformer responsible for boosting or reducing the input power. In addition, the electronic component package may further include a rectifier responsible for rectifying the transformed power.

The switcher may include a plurality of switching devices 11a. The switching devices 11a may be MOSFETs, but are not limited thereto. The transformer may include a transformer 11b. In addition, the rectifier may include a diode.

The electronic parts of the electronic component package may generate excessive heat compared to other parts thereof. That is, on the basis of FIG. 3, a high temperature region R1 may be formed in a relatively upper region.

Referring to FIG. 4, the cooling channel 120 may be disposed at the second surface 112 of the cooling panel 100. The cooling channel 120 may include a first channel region 121, into which cooling water is introduced and in which the cooling water is circulated, and a second channel region 122, in which the cooling water is circulated and through which the circulated cooling water is discharged.

A cooling water inlet 130 may be connected to the first channel region 121, and a cooling water outlet 140 may be connected to the second channel region 122. The cooling water inlet 130 and the cooling water outlet 140 may be disposed alongside each other at one side of the cooling panel 100. That is, the cooling channel 120 may include a U-shaped form.

The first channel region 121 may be distinguished from the second channel region 122 by a branch line 123 extending from one side, at which the cooling water inlet 130 is disposed, to the opposite side. That is, the first and second channel regions 121 and 122 may be symmetrical to each other based on an imaginary line P1 extending from the branch line 123.

The first and second channel regions 121 and 122 may respectively include a plurality of guides G1 and G2. Here, a density (or area) of the guides G1 disposed at the first channel region 121 may be higher than that of the guides G2 disposed at the second channel region 122. That is, the guides G1 of the first channel region 121 may be arranged more densely than the guides G2 of the second channel region 122.

A first region R2, in which the guides G1 and G2 are disposed at the first and second channel regions 121 and 122, may match the high temperature region R1 of FIG. 3. Since the first region R2 is a region that has a relatively higher hydraulic pressure compared to the remaining regions, cooling efficiency may be relatively reduced when an eddy or the like occurs. Accordingly, the guides G1 and G2 may be disposed at the first region R2 to increase cooling efficiency in the high temperature region R1.

Referring to FIG. 5, the first channel region 121 may include a first guide 131, a second guide 132, and a third guide 133 wherein the second and third guides 132 and 133 are arranged to face each other with respect to the first guide 131. The first to third guides 131, 132, and 133 may extend to a predetermined length along a moving direction of cooling water.

Since the first guide 131 is arranged to be closer to the cooling water inlet 130 than the second and third guides 132 and 133, introduced cooling water may be separated into two channels. Due to such a configuration, an eddy phenomenon may be prevented or a flow velocity of the cooling water may be uniformly maintained. A length L1 between one end 131a of the first guide 131 and the cooling water inlet 130 may be about 1 cm, but the present invention is not limited thereto.

The first channel region 121 may include a first tapered part 121a connected to the cooling water inlet 130. A width of the first tapered part 121a may increase as the first tapered part 121a recedes from the cooling water inlet 130. The width of the first tapered part 121a may be defined as a length perpendicular to the imaginary line P1. Due to such a configuration, hydraulic pressure of cooling water may be effectively controlled.

A length L2 between one end of each the second and third guides 132 and 133 and the cooling water inlet 130 may be shorter than a length L3 between a point P2 at which the first tapered part 121a has a maximum width and the cooling water inlet 130. Due to such a configuration, cooling water may again be separated into two channels by the second and third guides 132 and 133, and thus hydraulic pressure may be controlled. Accordingly, an occurrence of an eddy at the point P2 at which the first tapered part 121a has the maximum width may be decreased.

The first guide 131 may extend from the first channel region 121 to the second channel region 122, whereas the second and third guides 132 and 133 may be disposed only at the first channel region 121.

The second channel region 122 may include the first guide 131 and a fourth guide 134. Here, one end 134a of the fourth guide 134 may have a predetermined curvature. The second channel region 122 may include a second tapered region 122a connected to the cooling water outlet 140.

A plurality of protrusions 141 may be disposed at the first and second channel regions 121 and 122. The protrusions 141 may be formed by pressurizing the first surface 111. That is, when screw grooves for fixing an electronic component and/or a circuit board to the first surface 111 are formed at the first surface 111, the protrusions 141 may be formed at the second surface 112.

Since a relatively large number of electronic components are disposed at the first region R2, the number of the protrusions 141 disposed at the first channel region 121 may be greater than that of the protrusions 141 disposed at the second channel region 122.

Figure 6:
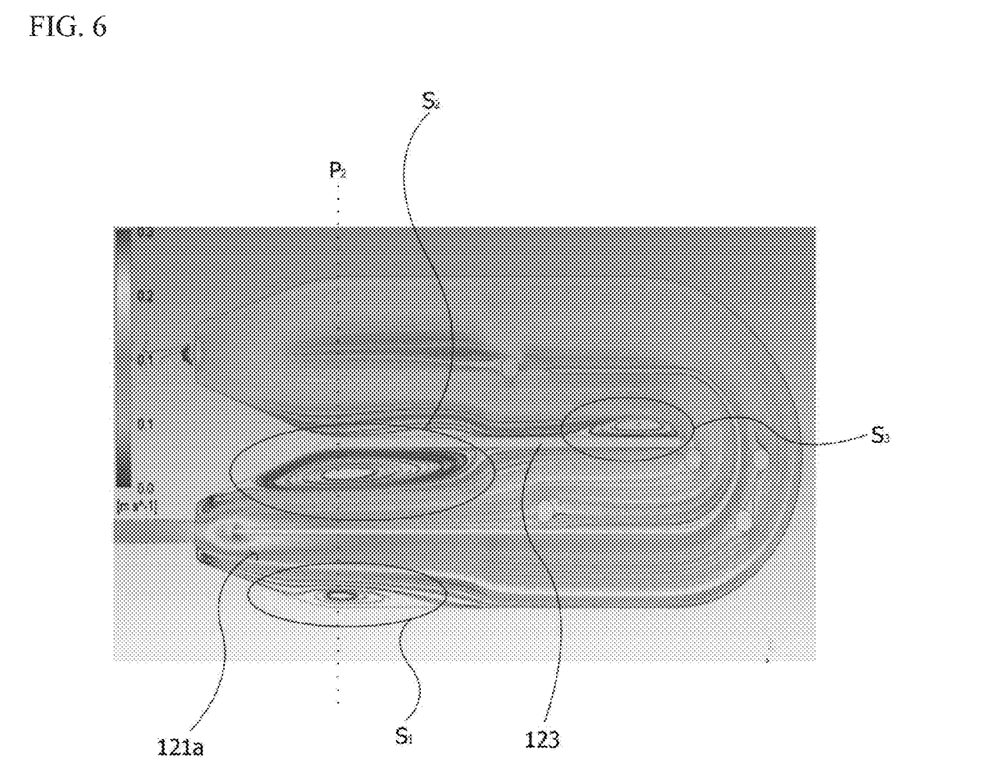
FIG. 6 illustrates a heat-flow analysis result of a cooling panel at which only a first guide part is disposed.
Figure 7:
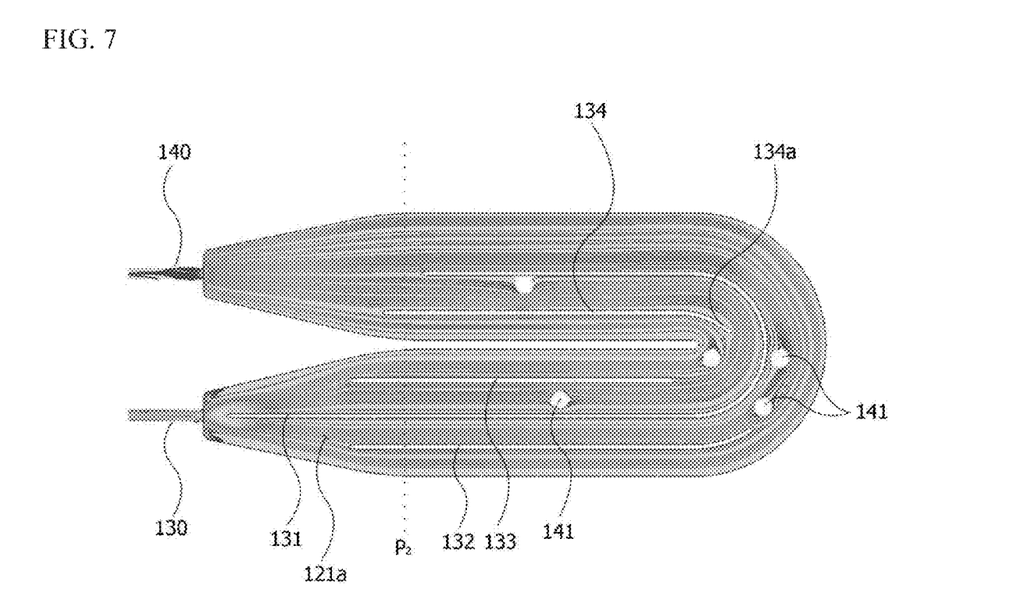
FIG. 7 illustrates a heat-flow analysis result of the cooling panel of FIG. 1.

FIG. 6 illustrates a heat-flow analysis result of a cooling panel at which only a first guide is disposed, and FIG. 7 illustrates a heat-flow analysis result of the cooling panel of FIG. 1.

Referring to FIG. 6, it can be seen that eddies S1 and S2 occur at the point P2 of the first tapered part 121a in the first channel region 121. In addition, it can be seen that an eddy S3 occurs at a region adjacent to the branch line 123 in the second channel region 122.

However, referring to FIG. 7, it can be seen that the occurrence of an eddy is decreased by the second and third guides 132 and 133 being provided. That is, the second and third guides 132 and 133 are arranged to protrude toward the cooling water inlet 130 more than the point P2 of the first tapered part 121a, and thus, a flow of cooling water may be improved and the occurrence of an eddy may be prevented.

In addition, it can be seen that the occurrence of an eddy is decreased by the fourth guide 134. Here, the curvature may be formed at the one end 134a of the fourth guide 134. Here, the curvature formed at the one end 134a of the fourth guide 134 may be smaller than a curvature of the first guide 131 at a position corresponding to the curvature of the one end 134a. Therefore, the flow velocity may be effectively controlled.

According to the embodiments of the present invention, cooling efficiency of heat can be improved by controlling a flow of cooling water by the guides. In addition, an occurrence of an eddy of cooling water can be decreased.

The present invention is not limited to the above description, and various beneficial advantages and effects of the present invention can be easily understood through the description of specific embodiments.

What is claimed is:
1. A cooling panel comprising:
first and second surfaces configured to face each other;
a cooling channel which is disposed on the second surface and in which cooling water is circulated;
a cooling water inlet which is disposed at one side of the cooling panel and connected to the first channel region; and
a cooling water outlet which is disposed at the one side of the cooling panel and connected to the second channel region,
wherein the cooling channel comprises a first channel region, into which cooling water is introduced, and a second channel region, through which the cooling water is discharged,
wherein each of the first and second channel regions comprises a plurality of guides,
wherein the first channel region comprises first, second and third guides, wherein the second and third guides are arranged to face each other with respect to the first guide, and
wherein one end of the first guide is arranged to be closer to the cooling water inlet than one end of each of the second and third guides.
2. The cooling panel according to claim 1, wherein density of the guides disposed at the first channel region is higher than density of the guides disposed at the second channel region.

3. The cooling panel according to claim 1, wherein the first and second channel regions have shapes that are symmetrical to each other.

4. The cooling panel according to claim 1,
wherein the first channel region comprises a first tapered part connected to the cooling water inlet, and
wherein a width of the first tapered part increases as the first tapered part recedes from the cooling water inlet.

5. The cooling panel according to claim 4, wherein a length between the one ends of the second and third guides and the cooling water inlet is shorter than a length between a point at which the first tapered part has a maximum width and the cooling water inlet.

6. The cooling, panel according to claim 1, wherein the first guide is formed to extend to the second, channel region.

7. The cooling panel according to claim 1, comprising a plurality of protrusions disposed at the first and second channel regions, wherein the number of protrusions disposed at the first channel region is greater than, the number of protrusions disposed at the second channel region.

8. The cooling panel according to claim 1, wherein the cooling channel, comprises a U-shaped form.

9. An electronic component package comprising:
a cooling panel including a first surface at which a plurality of electronic components and a circuit board are disposed and a second surface at which a cooling channel is formed;
a first cover configured to cover the first surface by being coupled to the cooling panel;
a second cover configured to, cover the second surface by being coupled to the cooling panel;
a cooling water inlet which is disposed at one side of the cooling panel and connected to the first channel region; and
a cooling water outlet which is disposed at the one side of the cooling panel and connected to the second channel region,
wherein the cooling channel comprises a first channel region, into which cooling water is introduced, and a second channel region, through which the cooling water is discharged,
wherein each of the first and second channel regions comprises a plurality of guides,
wherein the first channel region comprises first, second, and third guides, wherein the second and third guides are arranged to face each other with respect to the first guide, and
wherein one end of the first guide is arranged to be closer to the cooling water inlet than one end of each of the second and third guides.

10. The electronic component package according to claim 9, wherein density of the guides disposed at the first channel region is higher than density of the guides disposed at the second channel region.

11. The electronic component package according to claim 9,
wherein the first channel region comprises a first tapered part connected to the cooling, water inlet, and
wherein, a width of the first tapered part increases as the first tapered part recedes from the cooling water inlet.

12. The electronic component package according to claim 11, wherein a length between the one ends of the second and third guides and the cooling water inlet is shorter than a length between a point at which the first tapered part has a maximum width and the cooling water inlet.

13. The electronic component package according to claim 9, wherein the first guide is formed to extend to the second channel region.

14. The electronic component package according to claim 9, wherein the electronic components comprise at least one switching device and a transformer.

15. The electronic component package according to claim 14, wherein the switching device and the transformer are disposed at a region overlapping the first channel region.

16. The electronic component package according to claim 9, wherein the cooling channel comprises long and short sides, and the cooling water inlet and the cooling water outlet are disposed alongside each other at the short side.

17. The electronic component package according to claim 9, comprising a fourth guide which is disposed at the second channel region, wherein one end of the fourth guide is bent.

18. A vehicle comprising the electronic component package according to claim 9.

* * * * *